(12) United States Patent
Honda et al.

(10) Patent No.: US 9,425,120 B2
(45) Date of Patent: Aug. 23, 2016

(54) SEMICONDUCTOR DEVICE AND PRODUCTION METHOD THEREFOR

(71) Applicant: HITACHI CHEMICAL COMPANY, LTD., Tokyo (JP)

(72) Inventors: Kazutaka Honda, Tsukuba (JP); Akira Nagai, Tsukuba (JP); Makoto Satou, Yuki (JP)

(73) Assignee: HITACHI CHEMICAL COMPANY, LTD, Tokyo (JP)

( * ) Notice: Subject to any disclaimer, the term of this patent is extended or adjusted under 35 U.S.C. 154(b) by 0 days.

(21) Appl. No.: 14/380,455

(22) PCT Filed: Feb. 22, 2013

(86) PCT No.: PCT/JP2013/054538
§ 371 (c)(1),
(2) Date: Aug. 22, 2014

(87) PCT Pub. No.: WO2013/125684
PCT Pub. Date: Aug. 29, 2013

(65) Prior Publication Data
US 2015/0332983 A1    Nov. 19, 2015

(30) Foreign Application Priority Data

Feb. 24, 2012  (JP) .................. 2012-038544
May 25, 2012  (JP) .................. 2012-119762
Oct. 1, 2012  (WO) ................ PCT/JP2012/075412

(51) Int. Cl.
*H01L 23/48*     (2006.01)
*H01L 23/29*     (2006.01)
(Continued)

(52) U.S. Cl.
CPC ......... *H01L 23/293* (2013.01); *B23K 35/0222* (2013.01); *B23K 35/0233* (2013.01);
(Continued)

(58) Field of Classification Search
CPC ............... H01L 23/293; H01L 21/563; H01L 23/3157; H01L 24/17; H01L 24/81; H01L 24/83; H01L 24/92; H01L 25/0657
See application file for complete search history.

(56) References Cited

U.S. PATENT DOCUMENTS 4,168,996 A     9/1979  Zado
6,667,194 B1 *  12/2003 Crane .................. C07D 303/22
                                                    428/620

(Continued)

FOREIGN PATENT DOCUMENTS

CN      1374168      10/2002
CN      1395604 A     2/2003
(Continued)

OTHER PUBLICATIONS

International Preliminary Report of WO Appln. No. PCT/JP2012/075412 dated Sep. 4, 2014 in English.
(Continued)

*Primary Examiner* — Nicholas Tobergte
(74) *Attorney, Agent, or Firm* — Fitch, Even, Tabin & Flannery, LLP

(57) ABSTRACT

A manufacturing method for a semiconductor device in which connection portions of a semiconductor chip are electrically connected to connection portions of a wiring circuit substrate or a semiconductor device in which connection portions of a plurality of semiconductor chips are electrically connected to each other, the method comprising a step of sealing at least part of the connection portions with an adhesive for a semiconductor comprising a compound having a group represented by the following formula (1):

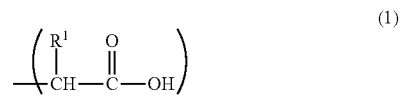

wherein $R^1$ represents an electron-donating group.

12 Claims, 4 Drawing Sheets

(51) Int. Cl.

| | |
|---|---|
| *H01L 23/31* | (2006.01) |
| *H01L 23/00* | (2006.01) |
| *C09J 11/06* | (2006.01) |
| *C09J 201/00* | (2006.01) |
| *C08L 63/00* | (2006.01) |
| *C08G 59/38* | (2006.01) |
| *H01L 21/56* | (2006.01) |
| *H01L 25/065* | (2006.01) |
| *B23K 35/02* | (2006.01) |
| *C08K 5/09* | (2006.01) |
| *C09J 163/00* | (2006.01) |
| *C09J 163/04* | (2006.01) |

(52) U.S. Cl.
CPC ........... *B23K35/0244* (2013.01); *C08G 59/38* (2013.01); *C08L 63/00* (2013.01); *C09J 11/06* (2013.01); *C09J 201/00* (2013.01); *H01L 21/563* (2013.01); *H01L 23/3157* (2013.01); *H01L 24/17* (2013.01); *H01L 24/81* (2013.01); *H01L 24/83* (2013.01); *H01L 24/92* (2013.01); *H01L 25/0657* (2013.01); *B23K 2201/40* (2013.01); *C08K 5/09* (2013.01); *C09J 163/00* (2013.01); *C09J 163/04* (2013.01); *H01L 24/13* (2013.01); *H01L 24/16* (2013.01); *H01L 24/29* (2013.01); *H01L 24/32* (2013.01); *H01L 2224/0401* (2013.01); *H01L 2224/05568* (2013.01); *H01L 2224/05573* (2013.01); *H01L 2224/05639* (2013.01); *H01L 2224/05644* (2013.01); *H01L 2224/05647* (2013.01); *H01L 2224/06181* (2013.01); *H01L 2224/08145* (2013.01); *H01L 2224/08225* (2013.01); *H01L 2224/13111* (2013.01); *H01L 2224/13139* (2013.01); *H01L 2224/13144* (2013.01); *H01L 2224/13147* (2013.01); *H01L 2224/16145* (2013.01); *H01L 2224/16146* (2013.01); *H01L 2224/16238* (2013.01); *H01L 2224/2919* (2013.01); *H01L 2224/32225* (2013.01); *H01L 2224/73104* (2013.01); *H01L 2224/73204* (2013.01); *H01L 2224/81192* (2013.01); *H01L 2224/81203* (2013.01); *H01L 2224/81815* (2013.01); *H01L 2224/83192* (2013.01); *H01L 2224/83203* (2013.01); *H01L 2224/83862* (2013.01); *H01L 2224/9211* (2013.01); *H01L 2225/06513* (2013.01); *H01L 2225/06517* (2013.01); *H01L 2924/00014* (2013.01); *H01L 2924/10253* (2013.01)

(56) References Cited

U.S. PATENT DOCUMENTS

| | | | | |
|---|---|---|---|---|
| 7,009,009 | B1* | 3/2006 | Crane | H01L 21/563 257/E21.503 |
| 2004/0026484 | A1 | 2/2004 | Yamashita et al. | |
| 2007/0104959 | A1* | 5/2007 | Asano | C08G 59/226 428/413 |
| 2008/0191347 | A1 | 8/2008 | Sawa et al. | |
| 2008/0265438 | A1* | 10/2008 | Asano | C08G 59/4215 257/778 |
| 2009/0092847 | A1 | 4/2009 | Onoe et al. | |
| 2010/0144977 | A1 | 6/2010 | Dershem | |
| 2010/0147567 | A1 | 6/2010 | Hino et al. | |
| 2011/0241228 | A1 | 10/2011 | Enomoto et al. | |
| 2012/0101191 | A1 | 4/2012 | Enomoto et al. | |
| 2012/0156502 | A1 | 6/2012 | Maejima et al. | |
| 2013/0131270 | A1 | 5/2013 | Shibutani et al. | |
| 2015/0014842 | A1 | 1/2015 | Honda et al. | |

FOREIGN PATENT DOCUMENTS

| | | |
|---|---|---|
| CN | 101437900 A | 5/2009 |
| CN | 101688099 A | 3/2010 |
| CN | 102190864 | 9/2011 |
| CN | 102453340 | 5/2012 |
| CN | 104145327 A | 11/2014 |
| JP | 2001-223227 | 8/2001 |
| JP | 2002-239785 | 8/2002 |
| JP | 2002-283098 | 10/2002 |
| JP | 2005-272547 | 10/2005 |
| JP | 2006-169407 | 6/2006 |
| JP | 2007-157373 | 6/2007 |
| JP | 2008-294382 | 12/2008 |
| JP | 2009-124126 A | 6/2009 |
| JP | 2011-016967 | 1/2011 |
| JP | 2011-054444 | 3/2011 |
| JP | 2011-178840 | 9/2011 |
| JP | 2011-0231137 | 11/2011 |
| JP | 2012-072211 | 4/2012 |
| JP | 2012-072213 | 4/2012 |
| TW | 201144348 A | 12/2011 |
| WO | 2010/117022 | 10/2010 |
| WO | 2011033743 A1 | 3/2011 |
| WO | 2011/062137 | 5/2011 |

OTHER PUBLICATIONS

International Preliminary Report of WO Appln. No. PCT/JP2013/054538 dated Sep. 4, 2014 in English.
International Search Report of WO Appln. No. PCT/JP2013/054541 dated Sep. 4, 2014 in English.
International Preliminary Report of WO Appln. No. PCT/JP2012/075414 dated Sep. 4, 2014 in English.
International Search Report of WO Appln. PCT/JP2013/054538 dated Apr. 2, 2013 in English.
JP Office Action of Appln. No. 2014-500861 dated Jun. 2, 2015.
CN Office Action of Appn. No. 201280070496.9 dated May 26, 2015.
U.S. Office Action of U.S. Appl. No. 14/379,961 dated Jun. 11, 2015.
Office Action dated Sep. 30, 2015 of non-counterpart U.S. Appl. No. 14/380,466 in English.
Office Action in counterpart CN Appln. No. 201280070496.9 dated Jan. 25, 2016.
Office Action in counterpart TW Appln. No. 101138291 dated Jan. 22, 2016.
Office Action in counterpart JP Appln. No. P2014-500952 dated Sep. 29, 2015.
Office Action in counterpart CN Appln. No. 201280070510.5 dated May 31, 2016.

* cited by examiner

SEMICONDUCTOR DEVICE AND PRODUCTION METHOD THEREFOR

TECHNICAL FIELD

The present invention relates to a manufacturing method for a semiconductor device using an adhesive for a semiconductor, and a semiconductor device prepared by the manufacturing method.

BACKGROUND ART

To connect a semiconductor chip to a substrate in the related art, a wire bonding method using metal thin lines such as gold wires is widely used. To meet requirements for e.g. higher functions, larger scale integration, and higher speed of semiconductor devices, a flip chip connection method (FC connection method) has been becoming popular, in which a conductive projection called a bump is disposed on a semiconductor chip or a substrate to directly connect the semiconductor chip to the substrate.

Examples of connection between the semiconductor chip and the substrate by the FC connection method also include a COB (Chip On Board) connection method frequently used in BGA (Ball Grid Array), CSP (Chip Size Package), and the like. The FC connection method is also widely used in a COC (Chip On Chip) connection method in which connection portions (bumps and wires) are disposed on semiconductor chips to connect semiconductor chips (see Patent Literature 1, for example).

Packages for which there is great demand for reductions in size and profile as well as higher functions increasingly use chip-stack package including chips layered and multi-staged by the connection method above, or POP (Package On Package), TSV (Through-Silicon Via), and the like. Such layering and multi-staging techniques dispose semiconductor chips and the like three-dimensionally, which can attain a smaller package than that in use of techniques of disposing semiconductor chips two-dimensionally. The layering and multi-staging techniques are effective in an improvement in performance of semiconductors and a reduction in noise, a packaging area, and energy consumption, and receive attention as a semiconductor wiring technique of the next generation.

Examples of metals typically used in the connection portion (bumps and wires) include solder, tin, gold, silver, copper, and nickel, and a conductive material containing a plurality of these is also used. The metal used in the connection portion may undesirably generate an oxidized film due to oxidation of the surface of the metal, or impurities such as an oxide may adhere to the surface of the metal to generate impurities on a connection surface of the connection portion. Such impurities, if they remain, may reduce connectivity and insulation reliability between the semiconductor chip and the substrate or between two semiconductor chips to impair the merits of using the connection method described above.

A method for suppressing generation of these impurities includes a method known as an OSP (Organic Solderbility Preservatives) treatment in which a connection portion is coated with an antioxidizing film; however, the antioxidizing film may cause a reduction in solder wettability during a connection process, a reduction in connectivity, and the like.

As a method for removing the oxidized film and impurities, a method for containing a fluxing agent in a semiconductor material has been proposed (see Patent Literatures 2 to 5, for example).

CITATION LIST

Patent Literature

Patent Literature 1: Japanese Patent Application Laid-Open No. 2008-294382
Patent Literature 2: Japanese Patent Application Laid-Open No. 2001-223227
Patent Literature 3: Japanese Patent Application Laid-Open No. 2002-283098
Patent Literature 4: Japanese Patent Application Laid-Open No. 2005-272547
Patent Literature 5: Japanese Patent Application Laid-Open No. 2006-169407

SUMMARY OF INVENTION

Technical Problem

Usually, metal connection is used to connect connection portions from the viewpoint of sufficiently ensuring connectivity and insulation reliability. If a semiconductor material does not have sufficient fluxing activity (an effect of removing the oxidized film and impurities on the surface of the metal), the oxidized film and impurities on the surface of the metal cannot be removed, and thus, good metal-metal connection may not be established and conduction may not be attained.

In the manufacturing process for the semiconductor device, a reduction in the connection time (bonding time) is required. Such a reduction in the connection time (bonding time), if attained, can improve productivity. Unfortunately, a reduced connection time may decrease connection reliability in general.

An object of the present invention is to provide a manufacturing method for a semiconductor device that can produce a larger number of reliable semiconductor devices in a shorter time, and a semiconductor device prepared by the manufacturing method.

Solution to Problem

An aspect according to the present invention relates to a manufacturing method for a semiconductor device in which connection portions of a semiconductor chip are electrically connected to connection portions of a wiring circuit substrate or a semiconductor device in which connection portions of a plurality of semiconductor chips are electrically connected to each other, the method comprising a step of sealing at least part of the connection portions with an adhesive for a semiconductor comprising a compound having a group represented by the following formula (1) (hereinafter referred to as a "sealing step" in some cases):

(1)

wherein $R^1$ represents an electron-donating group.

In this aspect, a highly reliable semiconductor device can be manufactured in a shorter time by sealing the connection portions with an adhesive for a semiconductor comprising a compound having a group represented by Formula (1).

The compound having a group represented by Formula (1) is preferably a compound having two carboxyl groups. The compound having two carboxyl groups barely volatizes at high temperatures during connection and can further reduce generation of voids, compared to the compound having one carboxyl group. Compared to a compound having three or more carboxyl groups, the compound having two carboxyl groups can further prevent an increase in viscosity of the adhesive for a semiconductor during e.g. preservation and working on connection to more significantly improve the connection reliability of the semiconductor device.

The compound having a group represented by Formula (1) is preferably a compound represented by the following formula (2):

(2)

wherein $R^1$ represents an electron-donating group; $R^2$ represents a hydrogen atom or an electron-donating group; n represents an integer of 0 to 15; and a plurality of $R^2$ may be identical or different from each other.

The compound having a group represented by Formula (1) is more preferably a compound represented by the following formula (3):

(3)

wherein $R^1$ represents an electron-donating group; $R^2$ represents a hydrogen atom or an electron-donating group; and m represents an integer of 0 to 10.

In Formula (3), m is preferably an integer of 0 to 5. At m of 5 or less, higher connection reliability is attained.

The compound having a group represented by Formula (1) has a melting point of preferably 150° C. or less. Such a compound can be fused in a shorter time to demonstrate fluxing activity; therefore, a semiconductor device having high connection reliability can be manufactured in a shorter time.

The electron-donating group is preferably an alkyl group having 1 to 10 carbon atoms. If the electron-donating group is an alkyl group having 1 to 10 carbon atoms, the advantageous effects of the invention are attained more remarkably.

The adhesive for a semiconductor may further contain a polymer component having a weight average molecular weight of 10000 or more. The polymer component can improve the film forming properties of the adhesive for a semiconductor to improve workability in the sealing step. The polymer component can also give heat resistance to a cured product of the adhesive for a semiconductor. Furthermore, in the adhesive for a semiconductor comprising the polymer component, the effect of the present invention due to the compound having a group represented by Formula (1) is attained more remarkably.

The adhesive for a semiconductor preferably has a film-like shape. This improves workability in the sealing step. A film-like adhesive can be bonded to a wafer, and be diced in batch; a singulation chip having an underfill fed thereto can be mass-produced in a simplified step to improve productivity.

Another aspect according to the present invention relates to a semiconductor device prepared by the manufacturing method. The semiconductor device according to the present invention has high connection reliability.

Advantageous Effect of Invention

The present invention can provide a manufacturing method for a semiconductor device that can produce a larger number of reliable semiconductor devices in a shorter time, and a semiconductor device prepared by the manufacturing method.

DESCRIPTION OF EMBODIMENTS

Hereinafter, suitable embodiments according to the present invention will be described in detail with reference to the drawings in some cases. In the drawings, same reference numerals are given to identical or equivalent portions, and duplication of description will be omitted. Positional relations such as up, down, left, and right are based on positional relations shown in the drawings unless otherwise specified. Dimensional ratios in the drawings will not be limited to ratios shown in the drawings.

<Semiconductor Device>

Figure 1:
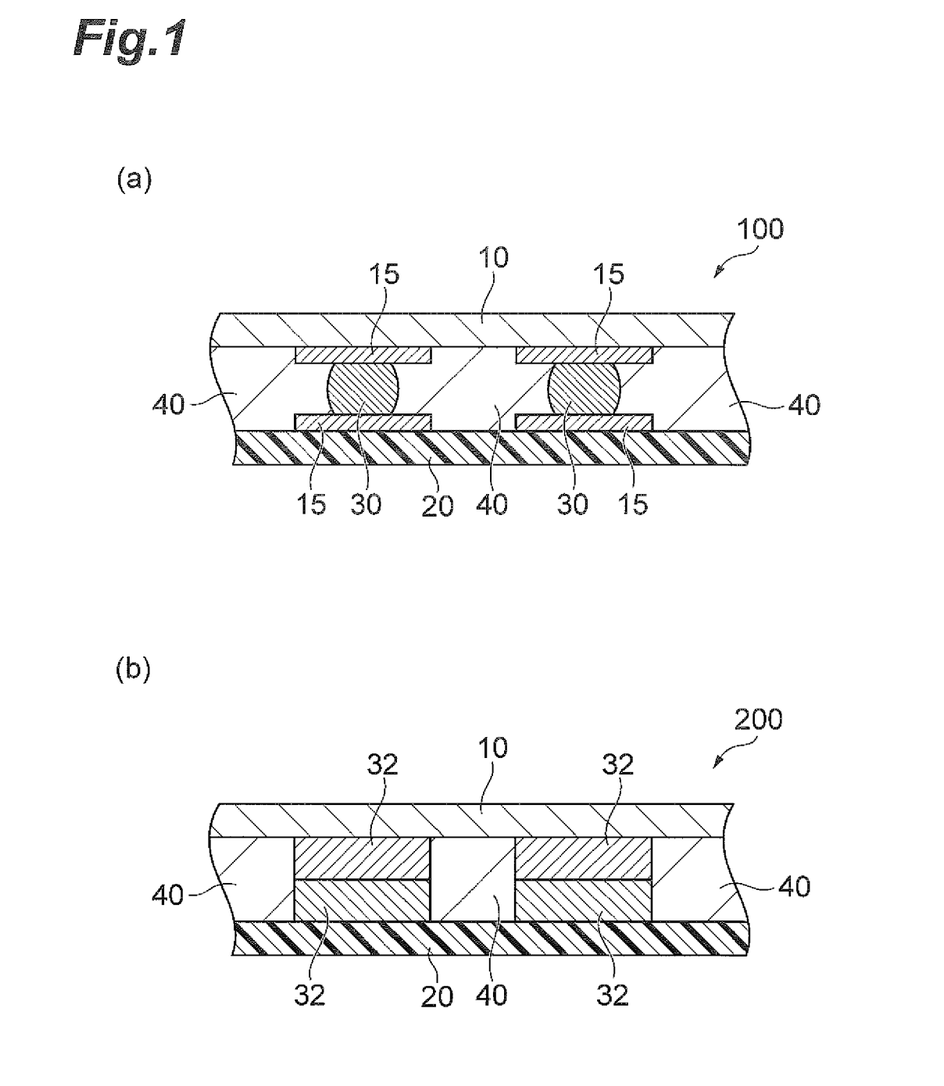
FIG. 1 is a schematic sectional view showing a semiconductor device according to one embodiment of the present invention.

Hereinafter, the semiconductor device according to the present embodiment will be described using FIGS. 1 and 2. FIG. 1 is a schematic sectional view showing a semiconductor device according to one embodiment of the present invention. As shown in FIG. 1(a), a semiconductor device 100 includes a semiconductor chip 10 and a substrate (circuit wiring substrate) 20 facing each other, wires 15 disposed on the surface of the semiconductor chip 10 and the surface of the substrate 20 facing each other, connection bumps 30 for connecting the wires 15 of the semiconductor chip 10 and the substrate 20 to each other, and an adhesive material 40 with which a gap between the semiconductor chip 10 and the substrate 20 is filled completely. The semiconductor chip 10 is flip chip connected to the substrate 20 through the wires 15 and the connection bumps 30. The wires 15 and the connection bumps 30 are sealed with the adhesive material 40 to be shielded against an external environment. The adhesive material 40 is a cured product of the adhesive for a semiconductor described later.

As shown in FIG. 1(b), a semiconductor device 200 includes a semiconductor chip 10 and a substrate 20 facing each other, bumps 32 disposed on the surface of the semiconductor chip 10 and the surface of the substrate 20 facing each other, and an adhesive material 40 with which a gap between the semiconductor chip 10 and the substrate 20 is filled completely. The semiconductor chip 10 is flip chip connected to the substrate 20 through connection of the facing bumps 32 to each other. The bumps 32 are sealed with the adhesive material 40 to be shielded against an external environment.

Figure 2:
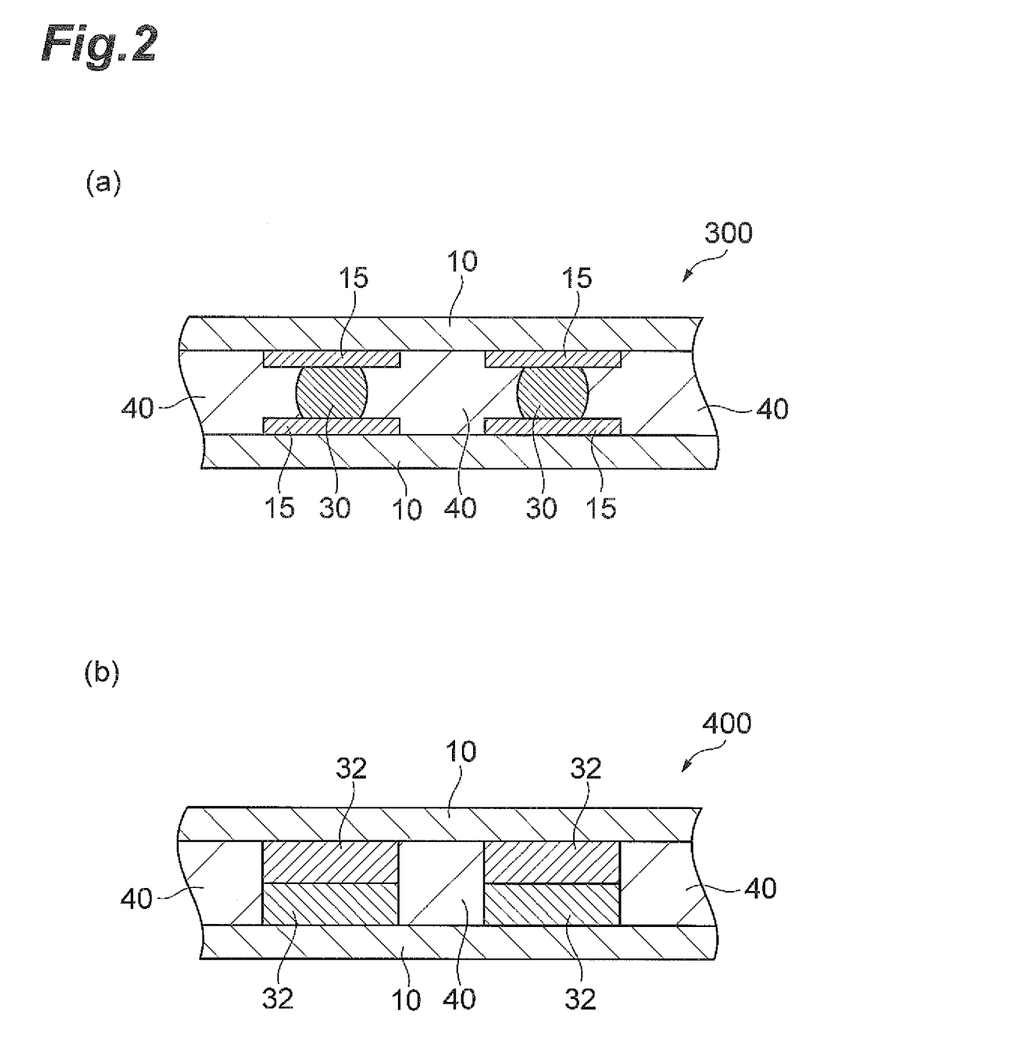
FIG. 2 is a schematic sectional view showing a semiconductor device according to another embodiment of the present invention.

FIG. 2 is a schematic sectional view showing a semiconductor device according to another embodiment of the present invention. As shown in FIG. 2(a), a semiconductor device 300 is similar to the semiconductor device 100 except that two semiconductor chips 10 are flip chip connected to each other through the wires 15 and the connection bumps 30. As shown in FIG. 2(b), a semiconductor device 400 is similar to the semiconductor device 200 except that two semiconductor chips 10 are flip chip connected to each other through the bumps 32.

Any semiconductor chip 10 can be used without particular limitation, and an element semiconductor composed of one identical element such as silicon and germanium or a compound semiconductor including gallium arsenic and indium phosphorus can be used.

For the substrate 20, any circuit substrate can be used without particular limitation; for example, a circuit substrate having wires (wire pattern) 15 formed on the surface of an insulating substrate including glass epoxy, polyimide, polyester, ceramic, epoxy, bismaleimide triazine, or the like as the main component by removing unnecessary portions of a metal film by etching; a circuit substrate having wires 15 formed on the surface of the insulating substrate by metal plating or the like; and a circuit substrate having wires 15 formed by printing a conductive substance on the surface of the insulating substrate.

The connection portions such as the wires 15 and the bumps 32 contain gold, silver, copper, solder (its main component is tin-silver, tin-lead, tin-bismuth, tin-copper, and tin-silver-copper, for example), nickel, tin, lead, or the like as the main component, and may contain a plurality of metals.

Among these metals, gold, silver, and copper are preferable, and silver and copper are more preferable from the viewpoint of a package whose connection portions have high electrical conductivity and thermal conductivity. From the viewpoint of a package at low cost, silver, copper, and solder are preferable, copper and solder are more preferable, and solder is still more preferable because these are inexpensive. An oxidized film formed on the surface of the metal at room temperature may reduce productivity or increase cost; from the viewpoint of prevention of formation of an oxidized film, gold, silver, copper, and solder are preferable, gold, silver, and solder are more preferable, and gold and silver are still more preferable.

A metal layer containing gold, silver, copper, solder (its main component is tin-silver, tin-lead, tin-bismuth, or tin-copper, for example), tin, nickel, or the like as the main component may be disposed on the surfaces of the wires 15 and the bumps 32 by plating, for example. The metal layer may be composed of a single component only, or may be composed of a plurality of components. The metal layer may have a structure in which one layer or a plurality of metal layers are laminated.

The semiconductor device according to the present embodiment may be formed into a multi-layered structure (package) in which a plurality of semiconductor devices as shown in the semiconductor devices 100 to 400 are laminated. In this case, the semiconductor devices 100 to 400 may be electrically connected to each other through bumps and wires containing gold, silver, copper, solder (its main component is tin-silver, tin-lead, tin-bismuth, tin-copper, or tin-silver-copper, for example), tin, nickel, or the like.

Figure 3:
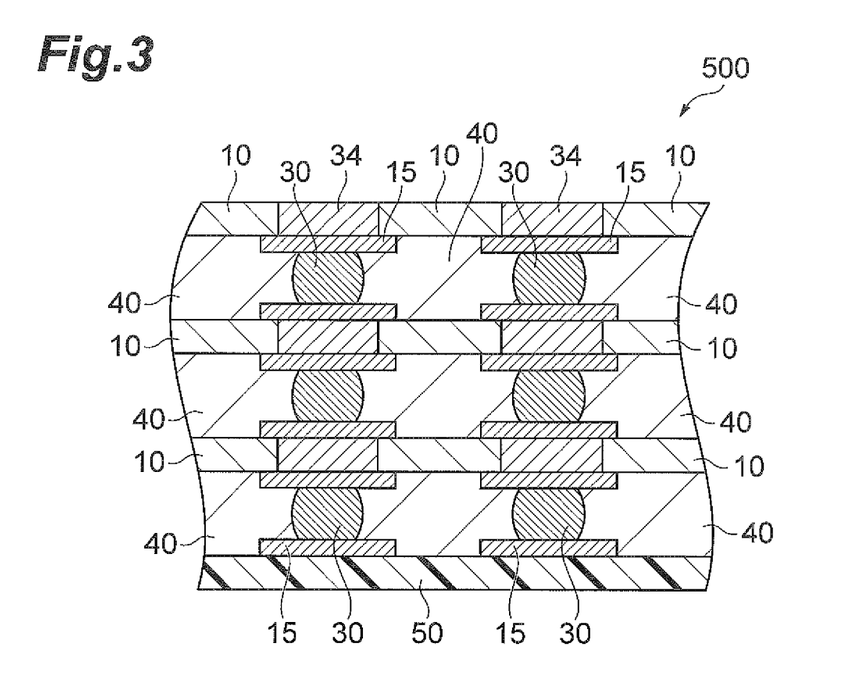
FIG. 3 is a schematic sectional view showing a semiconductor device according to another embodiment of the present invention.

Examples of a method for laminating several semiconductor devices include a TSV (Through-Silicon Via) technique as shown in FIG. 3. FIG. 3 is a schematic sectional view showing a semiconductor device according to another embodiment of the present invention, which is a semiconductor device produced by the TSV technique. In a semiconductor device 500 shown in FIG. 3, wires 15 disposed on an interposer 50 are connected to wires 15 on the semiconductor chip 10 through connection bumps 30 to flip chip connect the semiconductor chip 10 to the interposer 50. The gap between the semiconductor chip 10 and the interposer 50 is completely filled with an adhesive material 40. The semiconductor chip 10 is repeatedly laminated on the surface of the semiconductor chip 10 on the side opposite to the interposer 50 through the wires 15, connection bumps 30, and the adhesive material 40. The wires 15 disposed on patterned front and rear surfaces of the semiconductor chip 10 are connected to each other through penetrating electrodes 34 provided inside of holes penetrating through the semiconductor chip 10. Copper, aluminum or the like can be used as a material for the penetrating electrode 34.

Such a TSV technique enables acquisition of signals from the rear surface of the semiconductor chip, which is usually not used. Furthermore, the penetrating electrode 34 is vertically passed through the semiconductor chip 10 to reduce the distance between the facing semiconductor chips 10 or the distance between the semiconductor chip 10 and the interposer 50 to attain flexible connection. The adhesive for a semiconductor according to the present embodiment can be used as an adhesive for a semiconductor in the TSV technique to connect the facing semiconductor chips 10 or connect the semiconductor chip 10 to the interposer 50.

In a bump forming method having great freedom such as an area bump chip technique, the semiconductor chip can be directly packaged on a mother board without an interposer. The adhesive for a semiconductor according to the present embodiment can also be used in such direct packaging of the semiconductor chip on a mother board.

The adhesive for a semiconductor according to the present embodiment can be used to seal a gap between two wiring circuit substrates when the two substrates are laminated.

<Manufacturing Method for Semiconductor Device>

In the present embodiment, a semiconductor device can be manufactured as follows, for example. First, a substrate having a circuit formed thereon (circuit substrate) is prepared. Next, the adhesive for a semiconductor is fed to the circuit substrate so as to embed wires and connection bumps with the adhesive layer for a semiconductor to prepare a circuit member. After the adhesive layer for a semiconductor is disposed on the circuit substrate, solder bumps of the semiconductor chip are aligned with copper wires of the substrate with a connection apparatus such as a flip chip bonder, and the semiconductor chip and the substrate are pressed against each other while being heated at a temperature equal to or more than the melting point of the solder bump (when solder is used in the connection portion, a temperature of 240° C. or more is preferably applied to the solder portion) to connect the semiconductor chip to the substrate and seal the connection portions with a cured product of the adhesive layer for a semiconductor. The adhesive layer for a semiconductor comprises a compound having a group represented by the following formula (1):

(1)

wherein $R^1$ represents an electron-donating group.

Figure 4:
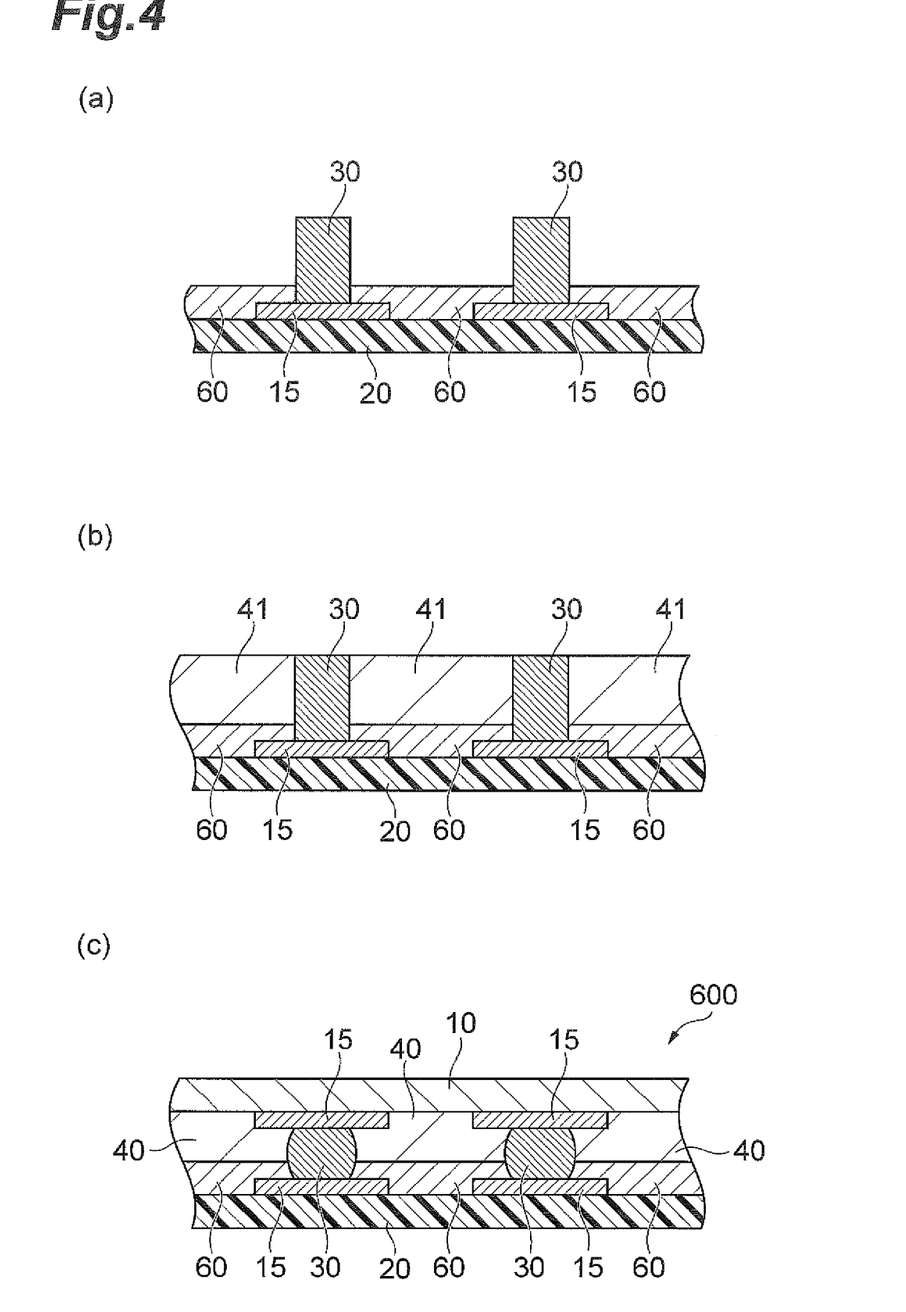
FIG. 4 is a drawing schematically showing steps as sectional views in one embodiment of a manufacturing method for a semiconductor device according to the present invention.

Hereinafter, the manufacturing method for a semiconductor device according to the present embodiment will be more specifically described using FIG. 4. FIG. 4 is a drawing schematically showing steps as sectional views in one embodiment of a manufacturing method for a semiconductor device according to the present invention.

First, a solder resist 60 is disposed on a substrate 20 having wires 15, the solder resist 60 having openings corresponding to positions of connection bumps 30 to be disposed, as shown in FIG. 4(a). The solder resist 60 does not always need to be disposed. When the solder resist is disposed on the substrate 20, however, generation of bridge between wires 15 can be suppressed to improve connection reliability and insulation reliability. The solder resist 60 can be disposed with a commercially available ink for a solder resist for package, for example. Examples of such a commercially available ink for a solder resist for package specifically include SR series (manufactured by Hitachi Chemical Co., Ltd., trade name) and PSR4000-AUS series (manufactured by TAIYO INK MFG CO., LTD., trade name).

Next, connection bumps 30 are disposed in the openings of the solder resist 60 as shown in FIG. 4(a). A film-like adhesive 41 for a semiconductor (hereinafter, referred to as a "film-like adhesive" in some cases) is applied to the substrate 20 having the connection bumps 30 and the solder resist 60 disposed thereon as shown in FIG. 4(b). The film-like adhesive 41 can be applied by heat press, roll lamination, or vacuum lamination, etc. The applied area and the thickness of the film-like adhesive 41 are properly set according to the sizes of the semiconductor chip 10 and the substrate 20 or the height of the connection bump 30.

After the film-like adhesive 41 is applied to the substrate 20 as above, the wires 15 of the semiconductor chip 10 are aligned with the connection bumps 30 with a connection apparatus such as a flip chip bonder. Then, the semiconductor chip 10 and the substrate 20 are press bonded while being heated at a temperature equal to or more than the melting point of the connection bump 30; thereby, the semiconductor chip 10 is connected to the substrate 20, and the gap between the semiconductor chip 10 and substrate 20 is filled and sealed with an adhesive material 40 which is a cured product of the film-like adhesive 41, as shown in FIG. 4(c). As above, a semiconductor device 600 is prepared.

In the manufacturing method for a semiconductor device according to the present embodiment, after alignment, the wires 15 of the semiconductor chip 10 may be temporarily fixed to the connection bumps 30 (through the adhesive for a semiconductor), and be subjected to heat treatment in a reflow furnace to fuse the connection bumps 30 to connect the semiconductor chip 10 to the substrate 20. In temporary fixing, formation of metal bonding is not always necessary; accordingly, press bonding can be performed at a smaller load, a shorter time, and a lower temperature than in the above method for press bonding while heating, so that productivity can be improved and degradation of the connection portions can be prevented.

Alternatively, after the semiconductor chip 10 is connected to the substrate 20, heat treatment step (curing step) may be performed in an oven or the like to further enhance connection reliability and insulation reliability. The heating temperature is preferably a temperature at which curing of the film-like adhesive progresses, more preferably a temperature at which the film-like adhesive completely cures. The heating temperature and the heating time are properly set.

In the curing step, a connection member is heated to promote curing of the adhesive for a semiconductor. The heating temperature and the heating time in the curing step, and the curing reaction rate of the adhesive for a semiconductor after the curing step can be set at any value without particular limitation as long as the adhesive material as the cured product demonstrates physical properties to satisfy the reliability of the semiconductor device.

The heating temperature and the heating time in the curing step are properly set so as to progress the curing reaction of the adhesive for a semiconductor, and are preferably set so as to completely cure the adhesive for a semiconductor. The heating temperature is preferably as low as possible from the viewpoint of a reduction in warpage. The heating temperature is preferably 100 to 200° C., more preferably 110 to 190° C., still more preferably 120 to 180° C. The heating time is preferably 0.1 to 10 hours, more preferably 0.1 to 8 hours, still more preferably 0.1 to 5 hours. A non-reacted adhesive for a semiconductor is preferably reacted as much as possible during the curing step, and the curing reaction rate after the curing step is preferably 95% or more. Heating in the curing step can be performed with a heating apparatus such as an oven.

In the manufacturing method for a semiconductor device according to the present embodiment, the film-like adhesive 41 may be applied to the semiconductor chip 10, and then the substrate 20 may be connected to the semiconductor chip 10. Alternatively, the semiconductor chip 10 may be connected to the substrate 20 through the wires 15 and the connection bumps 30, and then the gap between the semiconductor chip 10 and the substrate 20 may be filled with a paste adhesive for a semiconductor to cure the adhesive.

From the viewpoint of an improvement in productivity, the adhesive for a semiconductor may be fed to a semiconductor wafer having a plurality of semiconductor chips 10 connected, and then may be singulated by dicing to prepare a structure having the adhesive for a semiconductor fed on the semiconductor chip 10. When the adhesive for a semiconductor is a paste, wires and bumps on the semiconductor chip 10 may be embedded with the adhesive by a coating method such as spin coating, and the thickness of the adhesive may be made even, but the operation is not limited to this. In this case, because the amount of the resin to be fed is constant, productivity can be improved, and generation of voids due to insufficient embedding and a reduction in dicing properties can be suppressed. When the adhesive for a semiconductor is a film, the film-like adhesive for a semiconductor may be fed so as to embed wires and bumps on the semiconductor chip 10 by an application method such as heat press, roll lamination, and vacuum lamination, but the operation is not limited to this. In this case, because the amount of the resin to be fed is constant, productivity can be improved, and generation of voids due to insufficient embedding and a reduction in dicing properties can be suppressed.

The method for laminating a film-like adhesive for a semiconductor tends to attain better flatness of the adhesive for a semiconductor after feed, compared to the method of spin coating a paste adhesive for a semiconductor. For this reason, the adhesive for a semiconductor is preferably in a film form. The film-like adhesive has high applicability to a variety of processes, high handling properties, and the like.

The method of laminating a film-like adhesive to feed the adhesive for a semiconductor tends to more readily ensure the connectivity of the semiconductor device. Although the reason is not clear, the present inventors think as follows. Namely, the fluxing agent in the present embodiment tends to have a low melting point, and tends to readily demonstrate fluxing activity. For this reason, it is thought that for example, even if the connection bumps 30 of the substrate 20 are coated with an oxidized film, fluxing activity is demonstrated by heating when the film-like adhesive is laminated on the substrate 20, thereby to reduce and remove at least part of the oxidized film on the surfaces of the connection bumps 30. It is considered that, by this reduction and removal, at least part of the connection bumps 30 is exposed when the film-like adhesive is fed, and the exposed part of the bumps contribute to an improvement in connectivity.

Connection load is set in consideration of the number of connection bumps 30, a variation of the height thereof, or the amount of deformation of the connection bumps 30 or of the wire which is to receive the bump in the connection portion due to the pressure applied thereto. For connection temperature, the temperature in the connection portion is preferably equal to or more than the melting point of the connection bump 30, and may be a temperature at which metal bonding is formed in the respective connection portions (bumps and wires). When the connection bump 30 is a solder bump, a preferable temperature is approximately 240° C. or more. The connection temperature may be 500° C. or less, and may be 400° C. or less.

Although the connection time during connection varies depending on the metal that forms the connection portion, a shorter time is more preferable from the viewpoint of an improvement in productivity. When the connection bump 30 is a solder bump, the connection time is preferably 20 seconds or less, more preferably 10 seconds or less, still more preferably 5 seconds or less, further still more preferably 4 seconds or less, particularly preferably 3 seconds or less. In the case of metal connection with copper-copper or copper-gold, the connection time is preferably 60 seconds or less.

The adhesive for a semiconductor according to the present embodiment also exhibits high reflow resistance and connection reliability in the flip chip connection portions in the various package structures described above.

As above, suitable embodiments according to the present invention have been described, but the present invention will not be limited to these embodiments.

Hereinafter, one aspect of the adhesive for a semiconductor used in the present invention will be described.

<Adhesive for Semiconductor>

The adhesive for a semiconductor according to the present embodiment comprises a compound having a group represented by the following formula (1) (hereinafter, referred to as "Component (c)" in some cases). Furthermore, the adhesive for a semiconductor preferably comprises a thermosetting component from the viewpoint of adhesiveness. Any thermosetting component can be used without particular limitation, and an epoxy resin (hereinafter referred to as "Component (a)" in some cases) and a curing agent (hereinafter referred to as "Component (b)" in some cases) are preferably contained from the viewpoint of heat resistance and adhesiveness.

In Formula (1), $R^1$ represents an electron-donating group.

The adhesive for a semiconductor according to the present embodiment contains the compound having a group represented by Formula (1); thereby, a semiconductor device having high reflow resistance and connection reliability can be manufactured even if the adhesive is used as an adhesive for a semiconductor in a flip chip connection method by metal bonding to reduce the connection time. The present inventors think the reason as follows.

Usually, connection is performed while heating when flip chip connection is performed using an adhesive for a semiconductor; at this time, fluxing activity is demonstrated by also heating the adhesive for a semiconductor to the melting point of the fluxing agent. However, it is difficult to rapidly raise the temperature of the adhesive for a semiconductor, and to demonstrate fluxing activity in a short time. In contrast, the compound having a group represented by Formula (1) according to the present embodiment has a melting point lower than that of the standard fluxing agent, and tends to demonstrate fluxing activity at a lower temperature. Accordingly, the adhesive for a semiconductor according to the present embodiment can fuse in a short time to demonstrate fluxing activity, and therefore enables connection in a short time.

It is thought that, unlike the conventional fluxing agent having a linear skeleton, the compound having a group represented by Formula (1) has an electron-donating group at position 2 with respect to a carboxyl group, which leads to a lower melting point. It is thought that this enables connection in a short time.

Furthermore, when the compound represented by Formula (1) in the invention of the present application is contained, fluxing activity can be demonstrated while connection can be performed in a short time; a reduction in the adhesive force after absorption of moisture at high temperatures after connection can be suppressed and reflow resistance can be improved. The present inventors think that the conventional fluxing agent used, which is carboxylic acid, reduces the adhesive force for the following reasons.

Usually, the epoxy resin reacts with the curing agent to progress a curing reaction; at this time, the fluxing agent, i.e., carboxylic acid is incorporated into the curing reaction. Namely, an epoxy group of the epoxy resin may react with a carboxyl group of the fluxing agent to form ester bond. The ester bond readily hydrolyzes and so on due to absorption of moisture or the like, and this decomposition of the ester bond is considered to contribute to reduction in the adhesive force after the adhesive absorbs moisture.

In contrast, the adhesive for a semiconductor according to the present embodiment contains a compound having a group represented by Formula (1), namely, a carboxyl group including an electron-donating group near the carboxyl group. For this reason, in the adhesive for a semiconductor according to the present embodiment, sufficient fluxing activity is attained by the carboxyl group, and even if the ester bond is formed, the electron-donating group increases the density of electrons in the ester bonding portion to suppress the decomposition of the ester bond.

It is thought that in the present embodiment, because a substituent (electron-donating group) exists near the carboxyl group, steric hindrance suppresses the reaction of the carboxyl group with the epoxy resin; thereby, the ester bond is unlikely to form.

For these reasons, the composition of the adhesive for a semiconductor according to the present embodiment barely changes due to absorption of moisture or the like, therefore maintaining a high adhesive force. The action described above can be considered as that the curing reaction of the epoxy resin with the curing agent is barely inhibited by the fluxing agent, and therefore it can also be expected that the action sufficiently progresses the curing reaction of the epoxy resin with the curing agent to attain another effect of improving connection reliability.

The adhesive for a semiconductor according to the present embodiment may, as needed, contain a polymer component having a weight average molecular weight of 10000 or more (hereinafter, referred to as "Component (d)" in some cases). The adhesive for a semiconductor according to the present embodiment may, as needed, contain a filler (hereinafter, referred to as "Component (e)" in some cases).

Hereinafter, the respective components that form the adhesive for a semiconductor according to the present embodiment will be described.

Component (a): Epoxy Resin

Any epoxy resin having two or more epoxy groups in the molecule can be used without particular limitation. As Component (a), bisphenol A epoxy resins, bisphenol F epoxy resins, naphthalene epoxy resins, phenol novolak epoxy resins, cresol novolak epoxy resins, phenol aralkyl epoxy resins, biphenyl epoxy resins, triphenylmethane epoxy resins, dicyclopentadiene epoxy resins, and a variety of polyfunctional epoxy resins can be used, for example. These can be used singly or in combinations of two or more as a mixture.

To prevent Component (a) from decomposing to generate a volatile component during connection at high temperatures, an epoxy resin having a rate of thermal weight loss at 250° C. of 5% or less is preferably used when the temperature during connection is 250° C.; an epoxy resin having a rate of thermal weight loss at 300° C. of 5% or less is preferably used when the temperature during connection is 300° C.

The content of Component (a) is, for example, 5 to 75% by mass, preferably 10 to 50% by mass, more preferably 15 to 35% by mass based on the total amount of the adhesive for a semiconductor.

Component (b): Curing Agent

Examples of Component (b) include phenol resin curing agents, acid anhydride curing agents, amine curing agents, imidazole curing agents, and phosphine curing agents. Component (b) containing a phenolic hydroxyl group, an acid anhydride, an amine, or an imidazole exhibits fluxing activity to prevent generation of an oxidized film in the connection portion, improving connection reliability and insulation reliability. Hereinafter, the respective curing agents will be described.

(i) Phenol Resin Curing Agent

Any phenol resin curing agent having two or more phenolic hydroxyl groups in the molecule can be used without particular limitation; for example, phenol novolak resins, cresol novolak resins, phenol aralkyl resins, cresol naphthol formaldehyde polycondensates, triphenylmethane polyfunctional phenol resins, and a variety of polyfunctional phenol resins can be used. These can be used singly or in combinations of two or more as a mixture.

The equivalent ratio of the phenol resin curing agent to Component (a) (phenolic hydroxyl group/epoxy group, molar ratio) is preferably 0.3 to 1.5, more preferably 0.4 to 1.0, still more preferably 0.5 to 1.0 from the viewpoint of good curability, adhesiveness, and storage stability. At an equivalent ratio of 0.3 or more, curability and the adhesive force tend to be improved; at an equivalent ratio of 1.5 or less, a moisture absorbing rate tends to be controlled to be low because a non-reacted phenolic hydroxyl group does not excessively remain, thereby improving insulation reliability.

(ii) Acid Anhydride Curing Agent

For the acid anhydride curing agent, methylcyclohexane tetracarboxylic dianhydride, trimellitic anhydride, pyromellitic dianhydride, benzophenone tetracarboxylic dianhydride, and ethylene glycol bisanhydrotrimellitate can be used, for example. These can be used singly or in combinations of two or more as a mixture.

The equivalent ratio of the acid anhydride curing agent to Component (a) (acid anhydride group/epoxy group, molar ratio) is preferably 0.3 to 1.5, more preferably 0.4 to 1.0, still more preferably 0.5 to 1.0 from the viewpoint of good curability, adhesiveness, and storage stability. At an equivalent ratio of 0.3 or more, curability and the adhesive force tend to be improved; at an equivalent ratio of 1.5 or less, a moisture absorbing rate tends to be controlled to be low because non-reacted acid anhydride does not excessively remain, thereby improving insulation reliability.

(iii) Amine Curing Agent

For the amine curing agent, dicyandiamide can be used, for example.

The equivalent ratio of the amine curing agent to Component (a) (amine/epoxy group, molar ratio) is preferably 0.3 to 1.5, more preferably 0.4 to 1.0, still more preferably 0.5 to 1.0 from the viewpoint of good curability, adhesiveness, and storage stability. At an equivalent ratio of 0.3 or more, curability and the adhesive force tend to be improved; at an equivalent ratio of 1.5 or less, insulation reliability tends to be improved because non-reacted amine does not excessively remain.

(iv) Imidazole Curing Agent

Examples of the imidazole curing agent include 2-phenylimidazole, 2-phenyl-4-methylimidazole, 1-benzyl-2-methylimidazole, 1-benzyl-2-phenylimidazole, 1-cyanoethyl-2-undecylimidazole, 1-cyano-2-phenylimidazole, 1-cyanoethyl-2-undecylimidazole trimellitate, 1-cyanoethyl-2-phenylimidazolium trimellitate, 2,4-diamino-6-[2'-methylimidazolyl-(1')]-ethyl-s-triazine, 2,4-diamino-6-[2'-undecylimidazolyl-(1')]-ethyl-s-triazine, 2,4-diamino-6-[2'-ethyl-4'-methylimidazolyl-(1')]-ethyl-s-triazine, 2,4-diamino-6-[2'-methyl imidazolyl-(1')]-ethyl-s-triazine isocyanuric acid adducts, 2-phenylimidazole isocyanuric acid adducts, 2-phenyl-4,5-dihydroxymethylimidazole, 2-phenyl-4-methyl-5-hydroxymethylimidazole, and adducts of epoxy resins and imidazoles. Among these, 1-cyanoethyl-2-undecylimidazole, 1-cyano-2-phenylimidazole, 1-cyanoethyl-2-undecylimidazole trimellitate, 1-cyanoethyl-2-phenylimidazolium trimellitate, 2,4-diamino-6-[2'-methylimidazolyl-(1')]-ethyl-s-triazine, 2,4-diamino-6-[2'-ethyl-4'-methylimidazolyl-(1')]-ethyl-s-triazine, 2,4-diamino-6-[2'-methylimidazolyl-(1')]-ethyl-s-triazine isocyanuric acid adducts, 2-phenylimidazole isocyanuric acid adducts, 2-phenyl-4,5-dihydroxymethylimidazole, and 2-phenyl-4-methyl-5-hydroxymethylimidazole are preferable from the viewpoint of high curability, storage stability, and connection reliability. These can be used singly or in combinations of two or more. These may also be formed into a microcapsulized, latent curing agent.

The content of the imidazole curing agent is preferably 0.1 to 20 parts by mass, more preferably 0.1 to 10 parts by mass based on 100 parts by mass of Component (a). At a content of the imidazole curing agent of 0.1 parts by mass or more, curability tends to be improved; at a content of 20 parts by mass or less, failed connection tends to barely occur because the adhesive for a semiconductor is not cured before metal bonding is formed.

(v) Phosphine Curing Agent

Examples of the phosphine curing agent include triphenylphosphine, tetraphenylphosphonium tetraphenylborate, tetraphenylphosphonium tetra(4-methylphenyl)borate, and tetraphenylphosphonium (4-fluorophenyl)borate.

The content of the phosphine curing agent is preferably 0.1 to 10 parts by mass, more preferably 0.1 to 5 parts by mass based on 100 parts by mass of Component (a). At a content of the phosphine curing agent of 0.1 parts by mass or more, curability tends to be improved; at a content of 10 parts by mass or less, failed connection tends to barely occur because the adhesive for a semiconductor is not cured before metal bonding is formed.

These phenol resin curing agents, acid anhydride curing agents, and amine curing agents can be used singly or in combinations of two or more as a mixture. These imidazole curing agents and phosphine curing agents may each be used alone, or may be used in combination with the phenol resin curing agent, the acid anhydride curing agent, or the amine curing agent.

Component (b) is preferably a curing agent selected from the group consisting of phenol resin curing agents, amine curing agents, imidazole curing agents, and phosphine curing agents because storage stability is more significantly improved and decomposition or degradation due to absorption of moisture is difficult to occur. Component (b) is more preferably a curing agent selected from the group consisting of phenol resin curing agents, amine curing agents, and imidazole curing agents because the curing rate is easy to control and connection can be attained in a short time due to fast curing properties to improve productivity.

When the adhesive for a semiconductor contains the phenol resin curing agent, the acid anhydride curing agent, or the amine curing agent as Component (b), fluxing activity to remove an oxidized film can be demonstrated to improve connection reliability.

Factors to satisfy a reduction in voids and connectivity at the same time include a curing agent having low volatility (difficult to bubble), and a proper gelation time and viscosity that are easy to control. Factors for reliability (particularly reflow resistance) include low moisture absorbing properties (difficult to absorb moisture). From these viewpoints, as a curing agent, phenol resin curing agents, amine curing agents, imidazole curing agents, and phosphine curing agents are preferable, and phenol resin curing agents, amine curing agents, and imidazole curing agents are more preferable.

Component (c): Compound Having a Group Represented by Formula (1)

Component (c) is a compound having a group represented by Formula (1) (hereinafter, referred to as a "flux compound" in some cases). Component (c) is a compound having fluxing activity, and functions as a fluxing agent in the adhesive for a semiconductor according to the present embodiment. For Component (c), flux compounds may be used singly or in combinations of two or more.

In Formula (1), $R^1$ represents an electron-donating group.

Examples of the electron-donating group include an alkyl group, a hydroxyl group, an amino group, an alkoxy group, and an alkylamino group. For the electron-donating group, groups difficult to react with another component (such as the epoxy resin as Component (a)) are preferable; specifically, an alkyl group, a hydroxyl group, or an alkoxy group is preferable, and an alkyl group is more preferable.

An electron-donating group having stronger electron-donating properties tends to readily attain the effect of suppressing decomposition of the ester bond. An electron-donating group having large steric hindrance readily attains the effect of suppressing the reaction of a carboxyl group with an epoxy resin. The electron-donating group preferably has well-balanced electron-donating properties and steric hindrance.

An alkyl group having 1 to 10 carbon atoms is preferable, and an alkyl group having 1 to 5 carbon atoms is more preferable. A larger number of carbon atoms of an alkyl group tend to attain higher electron-donating properties and larger steric hindrance. An alkyl group having carbon atoms within the above range has well-balanced electron-donating properties and steric hindrance, and such an alkyl group attains the effect of the present invention more remarkably.

The alkyl group may be linear or branched; among these, linear alkyl groups are preferable. When the alkyl group is linear, the number of carbon atoms of the alkyl group is preferably equal to or less than the number of carbon atoms of the main chain of the flux compound from the viewpoint of the balance between electron-donating properties and steric hindrance. For example, when the flux compound is a compound represented by the following formula (2) and the electron-donating group is a linear alkyl group, the number of carbon atoms of the alkyl group is preferably equal to or less than the number of carbon atoms of the main chain of the flux compound (n+1).

An alkoxy group having 1 to 10 carbon atoms is preferable, and an alkoxy group having 1 to 5 carbon atoms is more preferable. A larger number of carbon atoms of an alkoxy group tend to attain higher electron-donating properties and larger steric hindrance. An alkoxy group having carbon atoms within the above range has well-balanced electron-donating properties and steric hindrance, and the alkoxy group attains the effect of the present invention more remarkably.

The alkoxy group may have a linear or branched alkyl group portion; among these, a linear alkyl group portion is preferable. When the alkoxy group is linear, the number of carbon atoms of the alkoxy group is preferably equal to or less than the number of carbon atoms of the main chain of the flux compound from the viewpoint of the balance between electron-donating properties and steric hindrance. For example, when the flux compound is a compound represented by the following formula (2) and the electron-donating group is a linear alkoxy group, the number of carbon atoms of the alkoxy group is preferably equal to or less than the number of carbon atoms of the main chain of the flux compound (n+1).

Examples of an alkylamino group include monoalkylamino groups and dialkylamino groups. A monoalkylamino group having 1 to 10 carbon atoms is preferable, and a monoalkylamino group having 1 to 5 carbon atoms is more preferable. The monoalkylamino group may have a linear or branched alkyl group portion; the alkyl group portion is preferably linear.

A dialkylamino group having 2 to 20 carbon atoms is preferable, and a dialkylamino group having 2 to 10 carbon atoms is more preferable. The dialkylamino group may have a linear or branched alkyl group portion; the alkyl group portion is preferably linear.

The flux compound is preferably a compound having two carboxyl groups (dicarboxylic acid). The compound having two carboxyl groups barely volatizes at high temperatures during connection and can further reduce generation of voids, compared to a compound having one carboxyl group (monocarboxylic acid). Compared to a case using a compound having three or more carboxyl groups, the use of the compound having two carboxyl groups can further prevent an increase in viscosity of the adhesive for a semiconductor during e.g. preservation and working on connection to more significantly improve the connection reliability of the semiconductor device.

For the flux compound, a compound represented by the following formula (2) can be suitably used. The compound represented by the following formula (2) can improve the reflow resistance and connection reliability of the semiconductor device more significantly.

(2)

In Formula (2), $R^1$ represents an electron-donating group; $R^2$ represents a hydrogen atom or an electron-donating group; n represents 0 or an integer of 1 or more; and a plurality of $R^2$ may be identical or different from each other.

In Formula (2), n is preferably 1 or more. At n of 1 or more, the flux compound barely volatizes at high temperatures during connection and can further reduce generation of voids, compared to cases at n of 0. In Formula (2), n is preferably 15 or less, more preferably 11 or less, and may be 6 or less or 4 or less. At n of 15 or less, higher connection reliability is attained.

For the flux compound, a compound represented by the following formula (3) is more suitable. The compound represented by the following formula (3) can more significantly improve the reflow resistance and connection reliability of the semiconductor device.

(3)

In Formula (3), $R^1$ represents an electron-donating group; $R^2$ represents a hydrogen atom or an electron-donating group; and m represents 0 or an integer of 1 or more.

In Formula (3), m is preferably 10 or less, more preferably 5 or less, still more preferably 3 or less. At m of 10 or less, higher connection reliability is attained.

In Formula (3), $R^2$ may be a hydrogen atom or an electron-donating group. If $R^2$ is a hydrogen atom, the compound tends to have a lower melting point, so that the connection reliability of the semiconductor device may be improved more significantly. If $R^1$ and $R^2$ are different electron-donating groups, compared to the cases wherein $R^1$ and $R^2$ are the same electron-donating group, the compound tends to have a lower melting point, so that the connection reliability of the semiconductor device may be improved more significantly.

Among the compounds represented by Formula (3), examples of compounds wherein $R^2$ is a hydrogen atom include methylsuccinic acid, 2-methylglutaric acid, 2-methyladipic acid, 2-methylpimelic acid, and 2-methylsuberic acid. These compounds can improve the connection reliability of the semiconductor device more significantly. Among these compounds, methylsuccinic acid and 2-methylglutaric acid are particularly preferable.

In Formula (3), if $R^1$ and $R^2$ are the same electron-donating group, the compound has a symmetrical structure and such a compound tends to have a higher melting point; even in this case, the effect of the present invention is sufficiently attained. In particular when the melting point is sufficiently low (150° C. or less), a compound having identical groups for $R^1$ and $R^2$ attains connection reliability equal to that of a compound having different groups for $R^1$ and $R^2$.

For example, a flux compound can be a compound including a dicarboxylic acid selected from succinic acid, glutaric acid, adipic acid, pimelic acid, suberic acid, azelaic acid, sebacic acid, undecanedioic acid, and dodecanedioic acid, the dicarboxylic acid having an electron-donating group at position 2 as a substituent.

A flux compound has a melting point of preferably 150° C. or less, more preferably 140° C. or less, still more preferably 130° C. or less. Such a flux compound is likely to sufficiently demonstrate fluxing activity before the curing reaction of the epoxy resin with the curing agent occurs. For this reason, an adhesive for a semiconductor having such a flux compound can attain a semiconductor device having higher connection reliability. A flux compound has a melting point of preferably 25° C. or more, more preferably 50° C. or more. A flux compound is preferably a solid at room temperature (25° C.).

The melting point of a flux compound can be measured with a standard melting point measurement apparatus. A small amount of a sample for measuring the melting point needs to be crushed into fine particles to reduce a difference in temperature in the sample. A container of the sample to be used is often a capillary tube whose one end is closed; in some measurement apparatuses, a sample is sandwiched between two cover glasses for a microscope instead of a container. A rapid increase in temperature generates temperature gradient between the sample and a thermometer to produce an error in the measurement; therefore, the temperature is desirably raised at a rate of 1° C./min or less when the melting point is measured.

The sample is prepared as fine particles as described above, and then the sample before fuse is opaque due to diffuse reflection on the surface of the sample. Usually, the temperature when the sample appears to be transparent is defined as the lower limit of the melting point; and the temperature when the sample is completely fused is defined as the upper limit. A variety of measurement apparatuses exist, and an apparatus most typically used is an apparatus including a double tube thermometer wherein a capillary tube containing a sample is mounted on the thermometer and is heated in a warm bath. To attach the capillary tube to the double tube thermometer, a viscous liquid is used as a liquid for the warm bath, and concentrated sulfuric acid or silicone oil is often used; the capillary tube is attached to the thermometer such that the sample is close to the bulb at the tip of the thermometer. Another melting point measurement apparatus for heating a sample with a metal heat block and automatically determining the melting point while measuring light transmittance and controlling heating can also be used.

Through the specification, the expression "melting point is 150° C. or less" indicates that the upper limit of the melting point is 150° C. or less, and the expression "melting point is 25° C. or more" indicates that the lower limit of the melting point is 25° C. or more.

The content of Component (c) is preferably 0.5 to 10% by mass, more preferably 0.5 to 5% by mass based on the total amount of the adhesive for a semiconductor.

Component (d): Polymer Component Having Weight Average Molecular Weight of 10000 or More The adhesive for a semiconductor according to the present embodiment may, as needed, contain a polymer component having a weight average molecular weight of 10000 or more (Component (d)). The adhesive for a semiconductor containing Component (d) has higher heat resistance and film forming properties.

Component (d) is preferably phenoxy resins, polyimide resins, polyamide resins, polycarbodiimide resins, cyanate ester resins, acrylic resins, polyester resins, polyethylene resins, polyethersulfone resins, polyether imide resins, polyvinyl acetal resins, urethane resins, and acrylic rubbers, for example, from the viewpoint of attaining high heat resistance, film forming properties, and connection reliability. Among these, phenoxy resins, polyimide resins, acrylic rubbers, acrylic resins, cyanate ester resins, and polycarbodiimide resins are more preferable from the viewpoint of higher heat resistance and film forming properties, and phenoxy resins, polyimide resins, acrylic rubbers, and acrylic resins are more preferable from the viewpoint of general versatility and easiness in control of e.g. the molecular weight and assignment of properties (during synthesis or the like). These Components (d) can be used singly or in combinations of two or more as a mixture or a copolymer. Component (d), however, does not contain any epoxy resin as Component (a).

Component (d) has a weight average molecular weight of 10000 or more, preferably 20000 or more, still more preferably 30000 or more. Component (d) as above can improve the heat resistance and film forming properties of the adhesive for a semiconductor more significantly.

Component (d) has a weight average molecular weight of preferably 1000000 or less, more preferably 500000 or less. Component (d) as above attains high heat resistance.

The weight average molecular weight refers to a weight average molecular weight measured by GPC (gel permeation chromatography) in terms of polystyrene. An example of the measurement condition in GPC will be shown below.

Apparatus: HCL-8320GPC, UV-8320 (product name, manufactured by Tosoh Corporation), or HPLC-8020 (product name, manufactured by Tosoh Corporation)

Column: TSKgel superMultiporeHZ-M×2, or 2 pieces of GMHXL+1 piece of G-2000 XL

Detector: RI or UV detector

Column temperature: 25 to 40° C.

Eluent: select a solvent in which the polymer component is soluble. For example, THF (tetrahydrofuran), DMF (N,N-dimethylformamide), DMA (N,N-dimethylacetoamide), NMP (N-methylpyrrolidone), and toluene. When a polar solvent is selected, the concentration of phosphoric acid may be adjusted to 0.05 to 0.1 mol/L (usually 0.06 mol/L), and the concentration of LiBr may be adjusted to 0.5 to 1.0 mol/L (usually 0.63 mol/L).

Flow rate: 0.30 to 1.5 mL/min

Standard substance: polystyrene

When the adhesive for a semiconductor contains Component (d), the ratio $C_a/C_d$ (mass ratio) of the content $C_a$ of Component (a) to the content $C_d$ of Component (d) is preferably 0.01 to 5, more preferably 0.05 to 3, still more preferably 0.1 to 2. At a ratio of $C_a/C_d$ of 0.01 or more, higher curability and a higher adhesive force are attained; at a ratio of $C_a/C_d$ of 5 or less, higher film forming properties are attained.

Component (e): Filler

The adhesive for a semiconductor according to the present embodiment may, as needed, contain a filler (Component (e)). Component (e) can control e.g. the viscosity of the adhesive for a semiconductor and the physical properties of a cured product of the adhesive for a semiconductor. Specifically, Component (e) can, for example, reduce generation of voids during connection, and reduce the moisture absorbing rate of the cured product of the adhesive for a semiconductor.

For Component (e), insulating inorganic fillers, whiskers, resin fillers, and the like can be used. These Components (e) can be used singly or in combinations of two or more.

Examples of insulating inorganic fillers include glass, silica, alumina, titanium oxide, carbon black, mica, and boron nitride. Among these, silica, alumina, titanium oxide, and boron nitride are preferable, and silica, alumina, and boron nitride are more preferable.

Examples of whiskers include boric acid aluminum, titanic acid aluminum, zinc oxide, silicic acid calcium, magnesium sulfate, and boron nitride.

Examples of resin fillers include fillers composed of resins such as polyurethane and polyimide.

The resin filler has a coefficient of thermal expansion lower than those of organic components (such as the epoxy resin and the curing agent), and is effective in improvement in connection reliability. The resin filler can readily control the viscosity of the adhesive for a semiconductor. The resin filler has a better function to relax stress than an inorganic filler does, and can reduce peel-off in a reflow test or the like more significantly.

The inorganic filler has a coefficient of thermal expansion lower than that of the resin filler, and can attain an adhesive composition having a low coefficient of thermal expansion. Many inorganic fillers are general-purpose products having a controlled particle size, and are preferable in control of viscosity.

The resin filler and the inorganic filler have their own advantageous effects; depending on application, one of these may be used, or both may be used by mixing to demonstrate the functions of these fillers.

Component (e) has any shape and any particle size, and can be contained in any content, without particular limitation. Component (e) may be surface-treated to have properly controlled physical properties.

The content of Component (e) is preferably 10 to 80% by mass, more preferably 15 to 60% by mass based on the total amount of the adhesive for a semiconductor.

Component (e) is preferably composed of an insulating material. Component (e) composed of a conductive substance (such as solder, gold, silver, and copper) may reduce insulation reliability (particularly HAST resistance).

(Other Components)

The adhesive for a semiconductor according to the present embodiment may contain additives such as an antioxidant, a silane coupling agent, a titanium coupling agent, a leveling agent, and an ion trap agent. These can be used singly or in combinations of two or more. The amounts of these contained may be properly adjusted to demonstrate the effects of the respective additives. The adhesive for a semiconductor according to the present embodiment preferably contains no conductive substance (such as solder, gold, silver, and copper) from the viewpoint of insulation reliability (particularly HAST resistance).

The adhesive for a semiconductor according to the present embodiment can be formed into a film. An example of a method for producing a film-like adhesive using the adhesive for a semiconductor according to the present embodiment will be shown below.

First, Component (a), Component (b), and Component (c), as well as Component (d), Component (e), etc. that are added as needed are added to an organic solvent, and are dissolved or dispersed by stirring and mixing or by kneading, etc. to prepare a resin varnish. Subsequently, the resin varnish is applied onto a base film subjected to a releasing treatment with a knife coater, a roll coater, an applicator, or the like; the organic solvent is removed by heating to dispose a film-like adhesive on the base film.

The film-like adhesive has any thickness without particular limitation; for example, the thickness is preferably 0.5 to 1.5 times, more preferably 0.6 to 1.3 times, still more preferably 0.7 to 1.2 times the sum of the heights of the connection portion of the semiconductor chip and that of the wiring circuit substrate (or those of a plurality of semiconductor chips).

If the film-like adhesive has a thickness of 0.5 times or more the sum of the heights of the connection portion, generation of voids caused by not filling the adhesive can be sufficiently reduced, and connection reliability can be improved more significantly. If the thickness is 1.5 times or less, the amount of the adhesive to be extruded from a connection region during connection can be sufficiently reduced, sufficiently preventing adhesion of the adhesive to unnecessary portions. If the film-like adhesive has a thickness of more than 1.5 times, a large amount of the adhesive must be removed from the connection portion, leading to failure in conduction. Removal of a large amount of the resin from the connection portion weakened because of a narrower pitch and an increasing number of pins (i.e., reduction in a bump diameter) is not preferable because the removal damages the connection portion significantly.

Because a standard connection portion after packaging is 5 to 100 μm, the thickness of the film-like adhesive is preferably 2.5 to 150 μm, more preferably 3.5 to 120 μm.

The organic solvent used to prepare the resin varnish is preferably those that can uniformly dissolve or disperse the respective components, and examples thereof include dimethylformamide, dimethylacetoamide, N-methyl-2-pyrrolidone, dimethyl sulfoxide, diethylene glycol dimethyl ether, toluene, benzene, xylene, methyl ethyl ketone, tetrahydrofuran, ethyl cellosolve, ethyl cellosolve acetate, butyl cellosolve, dioxane, cyclohexanone, and ethyl acetate. These organic solvents can be used singly or in combinations of two or more. In preparation of the resin varnish, stirring and mixing or kneading can be performed with a stirrer, a stone mill, a three-roll, a ball mill, a bead mill, or a homodisper, for example.

Any base film having heat resistance to endure a heating condition during volatilization of the organic solvent can be used without particular limitation, and examples thereof can include polyolefin films such as polypropylene films and polymethylpentene films; polyester films such as polyethylene terephthalate films and polyethylene naphthalate films; polyimide films, and polyether imide films. The base film is not limited to a single layer composed of one of these films, and may be a multi-layer film composed of two or more materials.

When the organic solvent is volatized from the resin varnish applied onto the base film, a preferable drying condition is a condition in which the organic solvent sufficiently volatizes; specifically, drying is preferably performed by heating at 50 to 200° C. for 0.1 to 90 minutes. The organic solvent is preferably removed to 1.5% by mass or less based on the total amount of the film-like adhesive.

The adhesive for a semiconductor according to the present embodiment may be disposed directly on a wafer. Specifically, the adhesive for a semiconductor may be disposed directly on a wafer, for example, by applying the resin varnish onto a wafer directly by spin coating to form a film, and then removing the organic solvent.

As above, suitable embodiments according to the present invention have been described, but the present invention will not be limited to these embodiments.

EXAMPLES

Hereinafter, the present invention will be more specifically described using Examples, but the present invention will not be limited to Examples.

The compounds used in Examples and Comparative Examples are as follows.

(a) Epoxy resin
  triphenolmethane skeleton-containing polyfunctional solid epoxy (manufactured by Japan Epoxy Resin Co., Ltd., trade name "EP1032H60", hereinafter referred to as "EP1032")
  bisphenol F liquid epoxy (manufactured by Japan Epoxy Resin Co., Ltd., trade name "YL983U", hereinafter referred to as "YL983")
  flexible epoxy (manufactured by Japan Epoxy Resin Co., Ltd., trade name "YL7175", hereinafter referred to as "YL7175")

(b) Curing agent
  2,4-diamino-6-[2'-methylimidazolyl-(1')]-ethyl-s-triazine isocyanuric acid adduct (manufactured by SHIKOKU CHEMICALS CORPORATION, trade name "2MAOK-PW", hereinafter referred to as "2MAOK")

(c) Fluxing agent containing compound having a group represented by Formula (1)
  2-methylglutaric acid (manufactured by Sigma-Aldrich, Inc., melting point: approximately 78° C.)
  methylsuccinic acid (manufactured by Sigma-Aldrich, Inc., melting point: approximately 116° C.)

(c') Another fluxing agent
  glutaric acid (manufactured by TOKYO CHEMICAL INDUSTRY CO., LTD., melting point: approximately 98° C.)
  succinic acid (manufactured by Sigma-Aldrich, Inc., melting point: approximately 188° C.)
  3-methylglutaric acid (manufactured by TOKYO CHEMICAL INDUSTRY CO., LTD., melting point: approximately 87° C.)
  adipic acid (manufactured by TOKYO CHEMICAL INDUSTRY CO., LTD., melting point: approximately 153° C.)

malonic acid (manufactured by Sigma-Aldrich, Inc., melting point: approximately 135 to 137° C.)

1,3,5-pentanetricarboxylic acid (manufactured by TOKYO CHEMICAL INDUSTRY CO., LTD., melting point: approximately 113° C., hereinafter referred to as "pentanetricarboxylic acid")

(d) Polymer component having molecular weight of 10000 or more phenoxy resin (manufactured by Tohto Kasei Co., Ltd., trade name "ZX1356-2", Tg: approximately 71° C., Mw: approximately 63000, hereinafter referred to as "ZX1356")

(e) Filler (e-1) Inorganic filler silica filler (manufactured by Admatechs Company Limited, trade name "SE2050", average particle size: 0.5 μm, hereinafter referred to as "SE2050")

expoxysilane-treated silica filler (manufactured by Admatechs Company Limited, trade name "SE2050-SEJ", average particle size: 0.5 μm, hereinafter referred to as "SE2050-SEJ")

acrylic-surface-treated nano silica filler (manufactured by Admatechs Company Limited, trade name "YA050 C-SM", average particle size: approximately 50 nm, hereinafter referred to as "SM nano silica")

(e-2) Resin filler organic filler (manufactured by ROHM AND HAAS JAPAN K. K., trade name "EXL-2655", core-shell type organic fine particle, hereinafter referred to as "EXL-2655")

The weight average molecular weight (Mw) of the polymer component is determined by GPC. Details of GPC are shown below.

Name of apparatus: HPLC-8020 (product name, manufactured by Tosoh Corporation)
Column: 2 pieces of GMHXL+1 piece of G-2000XL
Detector: RI detector
Column temperature: 35° C.
Flow rate: 1 mL/min
Standard substance: polystyrene Example 1

Preparation of Film-Like Adhesive for Semiconductor

An epoxy resin (3 g) ("EP1032": 2.4 g, "YL983": 0.45 g, "YL7175": 0.15 g), a curing agent "2MAOK" (0.1 g), 2-methylglutaric acid (0.1 g, 0.69 mmol), an inorganic filler (1.9 g) ("SE2050: 0.38 g, "SE2050-SEJ": 0.38 g, "SM nano silica": 1.14 g), a resin filler (EXL-2655) (0.25 g), and methyl ethyl ketone (an amount providing a solid content of 63% by mass) were placed; beads having a diameter of 0.8 mm and beads having a diameter of 2.0 mm were added in an amount equal to the weight of solid content; the mixture was stirred with a bead mill (manufactured by Fritsch Japan Co., Ltd., planetary pulverizing mill P-7) for 30 minutes. Subsequently, a phenoxy resin (ZX1356) (1.7 g) was added, and the mixture was stirred again with a bead mill for 30 minutes; the beads used in stirring were then removed by filtration to prepare a resin varnish.

The resin varnish thus prepared was applied onto a base film (manufactured by Teijin DuPont Films Japan Limited, trade name "Purex A53") with a compact precision coating apparatus (YASUI SEIKI COMPANY Ltd.), and was dried in a clean oven (manufactured by ESPEC Corp.) (70° C./10 min) to prepare a film-like adhesive.

Preparation of Semiconductor Device

A film-like adhesive prepared was cut into a predetermined size (length of 8 mm×width of 8 mm×thickness of 0.045 mm), and was bonded to a glass epoxy substrate (glass epoxy base material: 420 μm in thickness, copper wire: 9 μm in thickness); a semiconductor chip with solder bumps (chip size: length of 7.3 mm×width of 7.3 mm×thickness of 0.15 mm, bump height (total of a copper pillar+solder): approximately 40 μm, the number of bumps: 328) was packaged with a flip packaging apparatus "FCB3" (manufactured by Panasonic Corporation, trade name) (packaging condition: temperature of press bonding head: 350° C., press bonding time: 20 seconds, press bonding pressure: 0.5 MPa). Thereby, a semiconductor device was prepared in which the glass epoxy substrate was daisy chain connected to the semiconductor chip with solder bumps as in FIG. 4.

Examples 2 to 4

Semiconductor devices in Examples 2 to 4 were prepared in the same manner as in Example 1 except that the press bonding time was changed to 5 seconds, 3.5 seconds, and 2.5 seconds, respectively, in preparation of the semiconductor device.

Example 5

Semiconductor device in Example 5 was prepared in the same manner as in Example 1 except that the composition of the materials used was changed as shown in Table 1 below.

Examples 6 to 8

Semiconductor devices in Examples 6 to 8 were prepared in the same manner as in Example 5 except that the press bonding time was changed to 5 seconds, 3.5 seconds, and 2.5 seconds, respectively, in preparation of the semiconductor device.

Comparative Examples 1 to 5

Film-like adhesives in Comparative Examples 1 to 5 were prepared in the same manner as in Example 1 except that the composition of the materials used was changed as shown in Table 1 below.

Comparative Examples 6 to 10

Semiconductor devices in Comparative Examples 6 to 10 were prepared in the same manner as in Comparative Examples 1 to 5 except that the press bonding time was changed to 5 seconds in preparation of the semiconductor device.

Comparative Examples 11 to 15

Semiconductor devices in Comparative Examples 11 to 15 were prepared in the same manner as in Comparative Examples 1 to 5 except that the press bonding time was changed to 3.5 seconds in preparation of the semiconductor device.

Comparative Examples 16 to 20

Semiconductor devices in Comparative Examples 16 to 20 were prepared in the same manner as in Comparative Examples 1 to 5 except that the press bonding time was changed to 2.5 seconds in preparation of the semiconductor device.

Hereinafter, methods for evaluating the film-like adhesives and the semiconductor devices prepared in Examples and Comparative Examples will be shown.

(1) Evaluation of Film-Like Adhesive
(1-1) Measurement of Adhesive Force at 260° C. Before Absorption of Moisture A film-like adhesive prepared was cut into a predetermined size (length of 5 mm×width of 5 mm×thickness of 0.045 mm), and was bonded to a silicon chip (length of 5 mm×width of 5 mm×thickness of 0.725 mm, oxidized film coating) at 70° C.; the silicon chip was press bonded with a thermal press bonding tester (manufactured by Hitachi Chemical Techno-Plant Co., Ltd.) to a glass epoxy substrate (thickness: 0.02 mm) coated with a solder resist (manufactured by TAIYO INK MFG CO., LTD., trade name "AUS308") (press bonding condition: temperature of a press bonding head: 250° C., press bonding time: 5 seconds, press bonding pressure: 0.5 MPa). Next, the product was after-cured in a clean oven (manufactured by ESPEC Corp.) (175° C., 2 h) to prepare a semiconductor device as a test sample.

The adhesive force of the test sample on a hot plate at 260° C. was measured with an adhesive force measurement apparatus (manufactured by Dage Japan Co., Ltd., Optima Bondtester DAGE4000) at a tool height from the substrate of 0.05 mm and a tool rate of 0.05 mm/s (1-2) Measurement of Adhesive Force at 260° C. After Absorption of Moisture A film-like adhesive prepared was cut into a predetermined size (length of 5 mm×width of 5 mm×thickness of 0.045 mm), and was bonded to a silicon chip (length of 5 mm×width of 5 mm×thickness of 0.725 mm, oxidized film coating) at 70° C.; the silicon chip was press bonded with a thermal press bonding tester (manufactured by Hitachi Chemical Techno-Plant Co., Ltd.) to a glass epoxy substrate (thickness: 0.02 mm) coated with a solder resist (manufactured by TAIYO INK MFG CO., LTD., trade name "AUS308") (press bonding conditions: temperature of a press bonding head: 250° C., press bonding time: 5 seconds, press bonding pressure: 0.5 MPa). Next, the product was after-cured in a clean oven (manufactured by ESPEC Corp.) (175° C., 2 h) to prepare a semiconductor device as a test sample.

The test sample was left in a thermo-hygrostat (manufactured by ESPEC Corp., PR-2KP) at 85° C. and a relative humidity of 60% for 48 hours, and was taken out from the thermo-hygrostat; the adhesive force of the test sample on a hot plate at 260° C. was measured with an adhesive force measurement apparatus (manufactured by Dage Japan Co., Ltd., Optima Bondtester DAGE4000) at a tool height from the substrate of 0.05 mm and a tool rate of 0.05 mm/s (1-3) Insulation Reliability Test (HAST Test: Highly Accelerated Storage Test)

A film-like adhesive prepared (thickness: 45 μm) was bonded to a combed electrode evaluation TEG (manufactured by Hitachi Chemical Co., Ltd., wire pitch: 50 μm) without voids, and was cured in a clean oven (manufactured by ESPEC Corp.) at 175° C. for 2 hours. The sample after curing was placed in an accelerated life test apparatus (manufactured by HIRAYAMA MANUFACTURING CORPORATION, trade name "PL-422R8", condition: 130° C./85% RH/100 hours, 5 V applied) to measure insulation resistance. An insulation resistance after 100 hours of $10^8 \Omega$ or more was ranked as "A", an insulation resistance of $10^7 \Omega$ or more and less than $10^8 \Omega$ was ranked as "B", and an insulation resistance of less than $10^7 \Omega$ was ranked as "C".

(2) Evaluation of Semiconductor Device
(2-1) Evaluation of Initial Connectivity

The connection resistance value of the semiconductor device prepared was measured with a multimeter (manufactured by Advantest Corporation, trade name "R6871E") to evaluate initial conduction after packaging. A connection resistance value of 10.0 to 13.5Ω was ranked as good connectivity "A", a connection resistance value of 13.5 to 20Ω was ranked as bad connectivity "B"; a connection resistance value of more than 20Ω, a connection resistance value of less than 10Ω, and Open (resistance value not indicated) due to failed connection all were ranked as bad connectivity "C".

(2-2) Evaluation of Voids

In the semiconductor device prepared, an image of the appearance was taken with an ultrasonic image diagnostic apparatus (trade name "Insight-300", manufactured by Insight K.K), and an image of a bonding material layer on the chip (layer composed of a cured product of the adhesive for a semiconductor) was taken in with a scanner GT-9300UF (manufactured by Seiko Epson Corporation, trade name); the image was subjected to color tone correction and black and white conversion with an image processing software Adobe Photoshop to distinguish void portions, and the proportion of the void portions was calculated based on a histogram. Where the area of the bonding material portion on the chip was 100%, a void generation rate of 10% or less was ranked as "A", a void generation rate of 10 to 20% was ranked as "B", and a void generation rate of more than 20% was ranked as "C".

(2-3) Evaluation of Solder Wettability

In the semiconductor device prepared, a cross section of the connection portion was observed; 90% or more of the upper surface of a Cu wire wetted with solder was ranked as "A" (good), and less than 90% thereof was ranked as "B" (insufficient wettability).

(2-4) Evaluation of Reflow Resistance

The semiconductor device prepared was molded with an sealing material (manufactured by Hitachi Chemical Co., Ltd., trade name "CEL9750 ZHF10") at 180° C. and 6.75 MPa for 90 seconds, and was after-cured in a clean oven (manufactured by ESPEC Corp.) at 175° C. for 5 hours to prepare a package. Next, the package was allowed to absorb moisture at a high temperature under a JEDEC level 2 condition, and was passed through an IR reflow furnace (manufactured by FURUKAWA ELECTRIC Co. Ltd., trade name "SALAMANDER") three times. The connectivity of the package after reflow was evaluated by the same method as that in evaluation of the initial connectivity, and was defined as evaluation of reflow resistance. Good connection without peel-off was ranked as "A", and generation of peel-off and failed connection was ranked as "B".

(2-5) Evaluation of TCT Resistance (Evaluation of Connection Reliability)

The semiconductor device prepared was molded with an sealing material (manufactured by Hitachi Chemical Co., Ltd., trade name "CEL9750 ZHF10") at 180° C. and 6.75 MPa for 90 seconds, and was after-cured in a clean oven (manufactured by ESPEC Corp.) at 175° C. for 5 hours to prepare a package. Next, the package was connected to a cooling/heating cycle tester (manufactured by ETAC, trade name "THERMAL SHOCK CHAMBER NT1200"), and a current of 1 mA was flowed; where one cycle was 2 minutes at 25° C./15 minutes at −55° C./2 minutes at 25° C./15 minutes at 125° C./2 minutes at 25° C., 1000 cycles were repeated; change in connection resistance after 1000 cycles was evaluated. TCT resistance was ranked as "A" if no significant change was found after 1000 cycles compared to the waveform of the initial resistance value, and was ranked as "B" if a difference of 1Ω or more was found.

The results of evaluation of the film-like adhesives are shown in Table 1 and the results of evaluation of the semiconductor devices are shown in Tables 2 to 5.

TABLE 1

|  |  | Example | | Comparative Example | | | | |
|---|---|---|---|---|---|---|---|---|
|  |  | 1 | 5 | 1 | 2 | 3 | 4 | 5 |
| Raw materials | | | | | | | | |
| (a) Component (g) | EP1032 | 2.4 | 2.4 | 2.4 | 2.4 | 2.4 | 2.4 | 2.4 |
|  | YL983 | 0.45 | 0.45 | 0.45 | 0.45 | 0.45 | 0.45 | 0.45 |
|  | YL7175 | 0.15 | 0.15 | 0.15 | 0.15 | 0.15 | 0.15 | 0.15 |
| (b) Component (g) | 2MAOK | 0.1 | 0.1 | 0.1 | 0.1 | 0.1 | 0.1 | 0.1 |
| (d) Component (g) | ZX1356 | 1.7 | 1.7 | 1.7 | 1.7 | 1.7 | 1.7 | 1.7 |
| (e) Component (g) | SE2050 | 0.38 | 0.38 | 0.38 | 0.38 | 0.38 | 0.38 | 0.38 |
|  | SE2050-SEJ | 0.38 | 0.38 | 0.38 | 0.38 | 0.38 | 0.38 | 0.38 |
|  | SM Nano silica | 1.14 | 1.14 | 1.14 | 1.14 | 1.14 | 1.14 | 1.14 |
|  | EXL-2655 | 0.25 | 0.25 | 0.25 | 0.25 | 0.25 | 0.25 | 0.25 |
| (c) Component (mmol) | 2-methylglutaric acid | 0.69 | — | — | — | — | — | — |
|  | methylsuccinic acid | — | 0.69 | — | — | — | — | — |
| (c') Component (mmol) | Glutaric acid | — | — | — | — | — | — | — |
|  | Succinic acid | — | — | 0.69 | — | — | — | — |
|  | 3-methylglutaric acid | — | — | — | 0.69 | — | — | — |
|  | Adipic acid | — | — | — | — | 0.69 | — | — |
|  | Malonic acid | — | — | — | — | — | 0.69 | — |
|  | Pentanetricarboxylic acid | — | — | — | — | — | — | 0.69 |
| Results of evaluation | | | | | | | | |
| Adhesive force at 260° C. before absorption of moisture (MPa) | | 4.0 | 3.9 | 4.0 | 4.0 | 4.1 | — | — |
| Adhesive force at 260° C. after absorption of moisture (MPa) | | 3.1 | 3.1 | 2.7 | 2.6 | 2.6 | — | — |
| Reduction rate before and after absorption of moisture (%) | | 22.5 | 20.5 | 32.5 | 35.0 | 36.6 | — | — |
| Insulation reliability (HAST resistance) | | A | A | A | A | A | A | A |

TABLE 2

|  | Example | | Comparative Example | | | | |
|---|---|---|---|---|---|---|---|
| Press bonding time 20 seconds | 1 | 5 | 1 | 2 | 3 | 4 | 5 |
| Evaluation of initial connectivity | A | A | A | A | A | B | C |
| Evaluation of voids | A | A | B | A | A | C | A |
| Evaluation of solder wettability | A | A | A | A | A | B | B |
| Evaluation of reflow resistance | A | A | B | B | B | B | B |
| Connection reliability (TCT resistance) | A | A | A | A | A | B | — |

TABLE 3

|  | Example | | Comparative Example | | | | |
|---|---|---|---|---|---|---|---|
| Press bonding time 5 seconds | 2 | 6 | 6 | 7 | 8 | 9 | 10 |
| Evaluation of initial connectivity | A | A | A | A | A | B | C |
| Evaluation of voids | A | A | B | A | A | C | A |
| Evaluation of solder wettability | A | A | B | A | B | B | B |
| Evaluation of reflow resistance | A | A | B | B | B | B | B |
| Connection reliability (TCT resistance) | A | A | A | A | A | B | — |

TABLE 4

|  | Example | | Comparative Example | | | | |
|---|---|---|---|---|---|---|---|
| Press bonding time 3.5 seconds | 3 | 7 | 11 | 12 | 13 | 14 | 15 |
| Evaluation of initial connectivity | A | A | A | A | A | B | C |
| Evaluation of voids | A | A | B | A | A | C | A |
| Evaluation of solder wettability | A | A | B | A | B | B | B |
| Evaluation of reflow resistance | A | A | B | B | B | B | B |
| Connection reliability (TCT resistance) | A | A | A | A | A | A | A |

TABLE 5

|  | Example | | Comparative Example | | | | |
|---|---|---|---|---|---|---|---|
| Press bonding time 2.5 seconds | 4 | 8 | 16 | 17 | 18 | 19 | 20 |
| Evaluation of initial connectivity | A | A | A | A | A | B | C |
| Evaluation of voids | A | A | B | A | A | C | A |
| Evaluation of solder wettability | A | A | B | B | B | B | B |
| Evaluation of reflow resistance | A | A | B | B | B | B | — |
| Connection reliability (TCT resistance) | A | A | A | A | A | A | A |

The manufacturing method for a semiconductor device using an adhesive for a semiconductor comprising a compound having a group represented by Formula (1) enables connection in a short time, and attains good solder wettability. High reliability is also attained.

REFERENCE SIGNS LIST

10 . . . semiconductor chip, 15 . . . wire (connection portion), 20 . . . substrate (wiring circuit substrate), 30 . . . connection bump, 32 . . . bump (connection portion), 34 . . . penetrating electrode, 40 . . . bonding material, 41 . . . adhesive for a semiconductor (film-like adhesive), 50 . . . interposer, 60 . . . solder resist, 90 . . . combed electrode, 100, 200, 300, 400, 500, 600 . . . semiconductor device

The invention claimed is:
1. A manufacturing method for a semiconductor device, wherein connection portions of a semiconductor chip are electrically connected to connection portions of a wiring circuit substrate or connection portions of a plurality of semiconductor chips are electrically connected to each other, the method comprising:
a step of laminating a film-shaped adhesive for a semiconductor on the semiconductor chip, the adhe- sive for a semiconductor comprising a compound having a group represented by the following formula (1):

(1)

wherein $R^1$ represents an electron-donating group; and
a step of sealing at least part of the connection portions with a cured product of the adhesive for a semiconductor.

2. The manufacturing method for a semiconductor device according to claim 1, wherein the compound is a compound having two carboxyl groups.

3. The manufacturing method for a semiconductor device according to claim 1, wherein the compound is a compound represented by the following formula (2):

(2)

wherein $R^1$ represents an electron-donating group; $R^2$ represents a hydrogen atom or an electron-donating group; n represents an integer of 0 to 15; and a plurality of $R^2$ may be identical or different from each other.

4. The manufacturing method for a semiconductor device according to claim 1, wherein the compound is a compound represented by the following formula (3):

(3)

wherein $R^1$ represents an electron-donating group; $R^2$ represents a hydrogen atom or an electron-donating group; and m represents an integer of 0 to 10.

5. The manufacturing method for a semiconductor device according to claim 4, wherein m is an integer of 0 to 5.

6. The manufacturing method for a semiconductor device according to claim 4, wherein in Formula (3), $R^2$ is a hydrogen atom.

7. The manufacturing method for a semiconductor device according to claim 1, wherein the compound has a melting point of 150° C. or less.

8. The manufacturing method for a semiconductor device according to claim 1, wherein the electron-donating group is an alkyl group having 1 to 10 carbon atoms.

9. The manufacturing method for a semiconductor device according to claim 1, wherein the adhesive for a semiconductor further comprises a polymer component having a weight average molecular weight of 10000 or more.

10. The manufacturing method for a semiconductor device according to claim 1, wherein the compound is methylsuccinic acid, 2-methylglutaric acid, 2-methyladipic acid, 2-methylpimelic acid, or 2-methylsuberic acid.

11. A semiconductor device prepared by the manufacturing method according to claim 1.

12. The manufacturing method for a semiconductor device according to claim 1, wherein the adhesive for a semiconductor further comprises resin fillers.

* * * * *